(12) United States Patent
Asada et al.

(10) Patent No.: US 11,495,535 B2
(45) Date of Patent: Nov. 8, 2022

(54) FUSES TO MEASURE ELECTROSTATIC DISCHARGE DURING DIE TO SUBSTRATE OR PACKAGE ASSEMBLY

(71) Applicant: Advanced Micro Devices, Inc., Santa Clara, CA (US)

(72) Inventors: Gladney Asada, Santa Clara, CA (US); Regina Tien Schmidt, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 40 days.

(21) Appl. No.: 17/124,801

(22) Filed: Dec. 17, 2020

(65) Prior Publication Data
US 2022/0199524 A1 Jun. 23, 2022

(51) Int. Cl.
| | |
|---|---|
| *H01L 23/525* | (2006.01) |
| *H01L 23/528* | (2006.01) |
| *H01L 29/861* | (2006.01) |
| *H01L 23/00* | (2006.01) |
| *H01L 27/12* | (2006.01) |
| *H01L 21/66* | (2006.01) |

(52) U.S. Cl.
CPC .......... *H01L 23/5256* (2013.01); *H01L 22/34* (2013.01); *H01L 23/5283* (2013.01); *H01L 24/05* (2013.01); *H01L 27/1207* (2013.01); *H01L 29/861* (2013.01); *H01L 2224/0557* (2013.01)

(58) Field of Classification Search
CPC . H01L 23/5256; H01L 22/34; H01L 23/5283; H01L 24/05; H01L 27/1207; H01L 29/861; H01L 2224/0557; H01L 23/60–62
See application file for complete search history.

(56) References Cited

U.S. PATENT DOCUMENTS

| | | |
|---|---|---|
| 6,867,957 B1 | 3/2005 | Tong et al. |
| 6,924,673 B2 | 8/2005 | Tanishima |

(Continued)

OTHER PUBLICATIONS

International Search Report and Written Opinion in International Application No. PCT/US2011/042362, dated Sep. 30, 2011, 11 pages.

*Primary Examiner* — Mamadou L Diallo
(74) *Attorney, Agent, or Firm* — Kowert Hood Munyon Rankin and Goetzel PC; Rory D. Rankin

(57) ABSTRACT

A system and method for detecting and measuring electrostatic discharge during semiconductor assembly are described. A semiconductor device fabrication process forms a conductor between two metal routes in a series path on a semiconductor die. The series path is between a bump on the die and a substrate tie. The two metal routes have a width greater than a threshold based on a metal width capable of conducting a critical current density caused by an electrostatic discharge event without conductive failure or breakdown. The conductor has a width less than the threshold. When an electrostatic discharge event occurs, if the current exceeds a critical amount of current, the conductor experiences conductive breakdown and current ceases to flow. During later testing, this series path is tested for open connections, which indicate whether the conductor acting as an electrical on-die fuse experienced conductive failure during assembly of a semiconductor chip.

20 Claims, 6 Drawing Sheets

(56) References Cited

U.S. PATENT DOCUMENTS

| | | |
|---|---|---|
| 6,947,267 B2 | 9/2005 | Liu et al. |
| 7,423,472 B2 | 9/2008 | Hirose et al. |
| 7,511,550 B2 | 3/2009 | Bhattacharya et al. |
| 7,576,964 B2 | 8/2009 | Nakahara |
| 7,692,907 B2 | 4/2010 | Chen et al. |
| 7,809,925 B2 | 10/2010 | Mejdrich et al. |
| 8,400,743 B2 | 3/2013 | Kosonocky et al. |
| 10,497,677 B1 * | 12/2019 | Karp .................... H01L 25/0657 |
| 10,796,061 B1 * | 10/2020 | Schultz ................. G06F 30/394 |
| 2005/0064829 A1 | 3/2005 | Kang et al. |
| 2008/0062597 A1 * | 3/2008 | Chen .................... H01L 27/0292 |
| | | 361/56 |
| 2008/0067995 A1 | 3/2008 | Chua-Eoan et al. |
| 2008/0074171 A1 | 3/2008 | Bhattacharya et al. |
| 2008/0239780 A1 | 10/2008 | Sasaki et al. |
| 2009/0032939 A1 * | 2/2009 | Harper .................. H01L 24/11 |
| | | 257/E21.582 |
| 2011/0080678 A1 | 4/2011 | Zhao et al. |
| 2013/0187280 A1 * | 7/2013 | Yuan .................... H01L 23/585 |
| | | 257/773 |
| 2018/0226364 A1 * | 8/2018 | Kim ....................... H01L 24/14 |
| 2020/0343237 A1 * | 10/2020 | Karp .................... H01L 27/0255 |
| 2021/0193596 A1 * | 6/2021 | Elsherbini ............... H01L 23/60 |
| 2021/0305178 A1 * | 9/2021 | West ...................... H01L 23/60 |

\* cited by examiner

Method 600

```
┌─────────────────────────────────────┐
│ Form, in a semiconductor device,    │
│ multiple metal routes with a first  │
│ width and the multiple metal routes │
│ are separated from one another in   │
│ a series configuration using a      │
│ first metal layer of multiple       │
│ metal layers                        │
│ 602                                 │
└─────────────────────────────────────┘
                  ↓
┌─────────────────────────────────────┐
│ Form multiple conductors with a     │
│ second width less than the first    │
│ width between any two of the        │
│ multiple metal routes, and in       │
│ between any two of the multiple     │
│ metal routes, one or more conductors│
│ are connected in a parallel         │
│ configuration with one another      │
│ 604                                 │
└─────────────────────────────────────┘
                  ↓
┌─────────────────────────────────────┐
│ Form a first via on a first metal   │
│ route of the multiple metal routes  │
│ 606                                 │
└─────────────────────────────────────┘
                  ↓
┌─────────────────────────────────────┐
│ Form a second via between a second  │
│ metal route of the multiple metal   │
│ routes and a silicon substrate of   │
│ the semiconductor device            │
│ 608                                 │
└─────────────────────────────────────┘
                  ↓
┌─────────────────────────────────────┐
│ Place a bump on the first via to    │
│ make contact with a semiconductor   │
│ package or a semiconductor wafer    │
│ 610                                 │
└─────────────────────────────────────┘
```

FIG. 6

FUSES TO MEASURE ELECTROSTATIC DISCHARGE DURING DIE TO SUBSTRATE OR PACKAGE ASSEMBLY

BACKGROUND

Description of the Relevant Art

Advances in semiconductor fabrication techniques have been reducing transistor dimensions in order to increase both performance and functionality within the same amount of space. The supply voltages for the integrated circuits have been scaling down to reduce both power consumption and short channel effects. Therefore, an amount of inadvertent charge developed on these nodes that causes a current density to flow through metal wires and transistors (devices) that surpass safe thresholds also lowers substantially. Both planar transistors and non-planar transistors are fabricated for use in integrated circuits within semiconductor chips. A variety of choices exist for placing processing circuitry in system packaging to integrate the multiple types of integrated circuits. Some examples are a system-on-a-chip (SOC), multi-chip modules (MCMs) and a system-in-package (SiP). Mobile devices, desktop systems and servers use these packages.

Regardless of the choice for system packaging, during assembly of semiconductor chips, one or more die are placed onto a single substrate or onto a package, and these die are susceptible to an electrostatic discharge event. Despite many precautions taken to prevent objects in a manufacturing facility from developing opposing electrostatic charge, during the semiconductor chip assembly steps, it is possible for electrostatic charge of opposing polarity to develop on machinery. This machinery includes, but is not limited to, the holder of the die and the holder of the single substrate or the package on which the die is placed.

In view of the above, efficient methods and mechanisms for detecting and measuring electrostatic discharge during semiconductor assembly are desired.

BRIEF DESCRIPTION OF THE DRAWINGS

FIG. 6 is a generalized diagram of one embodiment of a method for detecting and measuring electrostatic discharge during semiconductor assembly.

Figure 1:
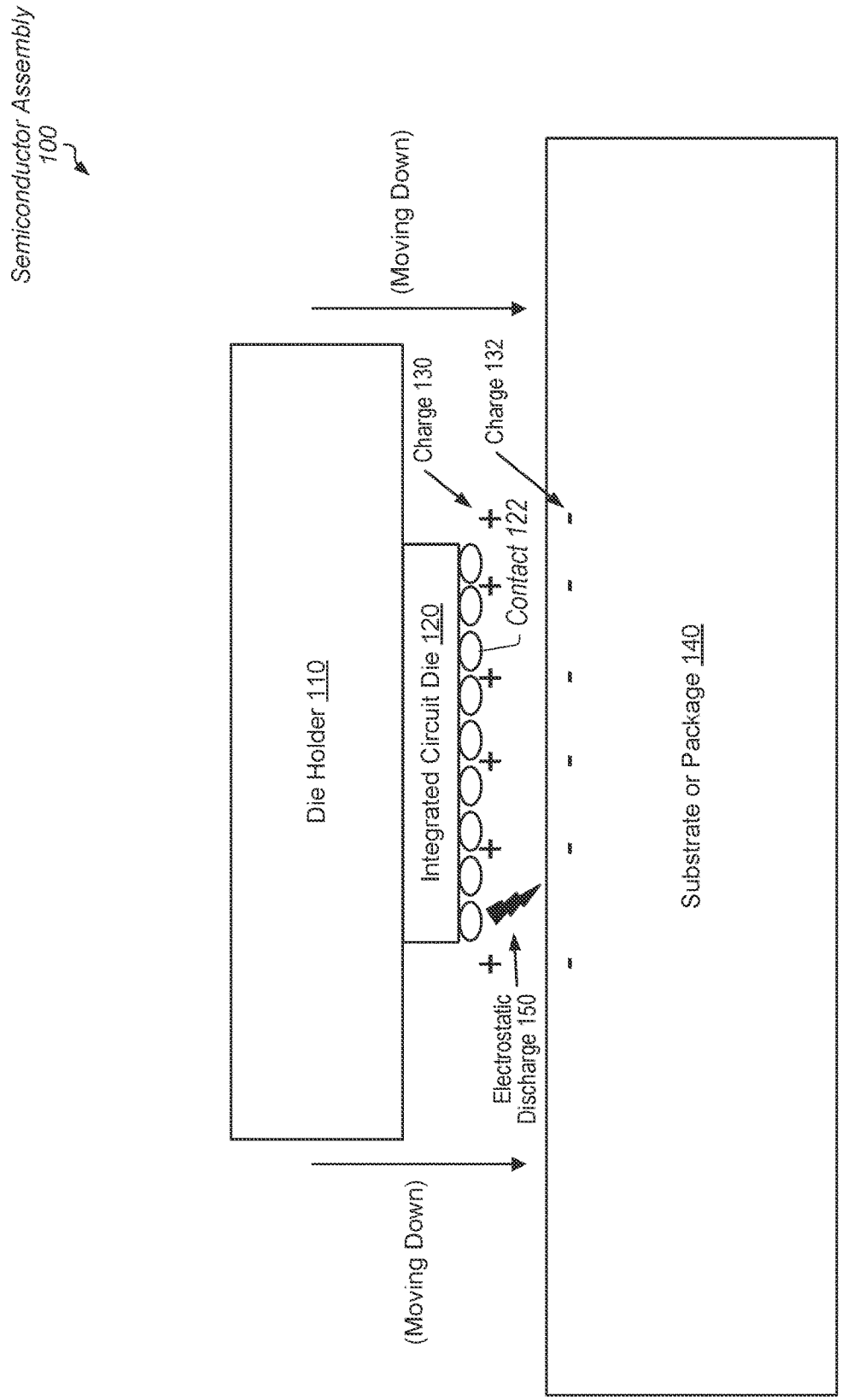
FIG. 1 is a generalized diagram of one embodiment of semiconductor assembly.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for detecting and measuring electrostatic discharge during semiconductor assembly are contemplated. In various embodiments, a semiconductor device fabrication process forms a conductor between two metal routes in a series path on a semiconductor die. The series path is between a bump on the die and a substrate tie. The two metal routes have a width greater than a threshold based on a metal width capable of conducting a critical current density caused by an electrostatic discharge event without conductive failure or breakdown. The conductor has a width less than the threshold. When an electrostatic discharge event occurs, the resulting current flows through the bump, a via that connects to one of the two metal routes, and through the conductor. If the current exceeds a critical amount of current, the conductor experiences conductive breakdown and current ceases to flow. If the current does not exceed the critical amount of current, the conductor continues to conduct the current, which continues to flow to the other one of the two metal routes, through another via connected to this metal route, and to the substrate tie. During later testing, this series path is tested for open connections, which indicate whether the conductor acting as an electrical on-die fuse experienced conductive failure during assembly of a semiconductor chip.

Turning to FIG. 1, a generalized block diagram of one embodiment of semiconductor assembly 100 is shown. The semiconductor assembly 100 includes a semiconductor die (or die) holder 110 grasping an integrated circuit die (or die) 120, which is to be placed on a flat surface of a substrate or package 140. The semiconductor assembly 100 is used in a semiconductor fabrication facility used for semiconductor chip fabrication (manufacturing), chip testing, or both. Although many precautions are taken to prevent objects in a manufacturing facility from developing differences in electrostatic charge, it is possible for electrostatic charge of opposing polarity to develop on machinery. For example, at least the die holder 110 is a robotic arm used for placing dies on flat surfaces of another substrate for flip chip manufacturing or on flat surfaces of a package. One or more of the robotic arm performing the function of the die holder 110 and a tray holding the substrate or package 140 still develops an electrostatic charge different from the other one of the die holder 110 and the substrate or package 140. This electrostatic charge is shown as charge 130 and charge 132.

In various embodiments, the die 120 uses contacts 122 to provide a conductive path between nodes on the die 120 and the external silicon substrate or external package 140. In some embodiments, the contact 202 is a metal ball used for flip chip packaging or used for solder connections to a package. The contacts 122 include one of a variety of metals used for conducting current. When the contacts 122 actually touch the substrate or package 140, the potential difference caused by the opposing polarities of the charge 130 and the charge 132 creates the electrostatic discharge event 150. If the electrostatic discharge event 150 cause an amount of current to flow through nodes, devices and metal wires of the die 120 that exceed a critical current density for these elements, then these elements experience conductive failure or breakdown. Consequently, the die 120 becomes damaged.

Although not shown for ease of illustration, in various embodiments, the die 120 includes one or more electrical on-die fuses that both detect the electrostatic discharge event 150 and measure an amount of current that flowed as a result of the electrostatic discharge event 150. In contrast to using capacitors that break down based on the potential difference (voltage level) caused by the opposing polarities of the charge 130 and the charge 132, the on-die fuses of the die 120 uses one of a variety of resistive elements that break down based on a current density flowing through the resistive elements exceeded a critical current density.

After placement of the die 120 on the substrate or package 140, particular contacts of the contacts 120 are measured for open connections. Open connections indicate that resistive elements used as on-die fuses experienced conductive failure or breakdown, and the die 120 is consequently determined to be damaged. However, the location of the on-die fuses that experienced breakdown indicates where on the die 120 that the electrostatic discharge event 150 occurred, and adjustments can be made for the holder 110 and any tray holding the substrate or package 140. Precautions regarding removing electrostatic discharge are also revisited for adjustments.

Figure 2:
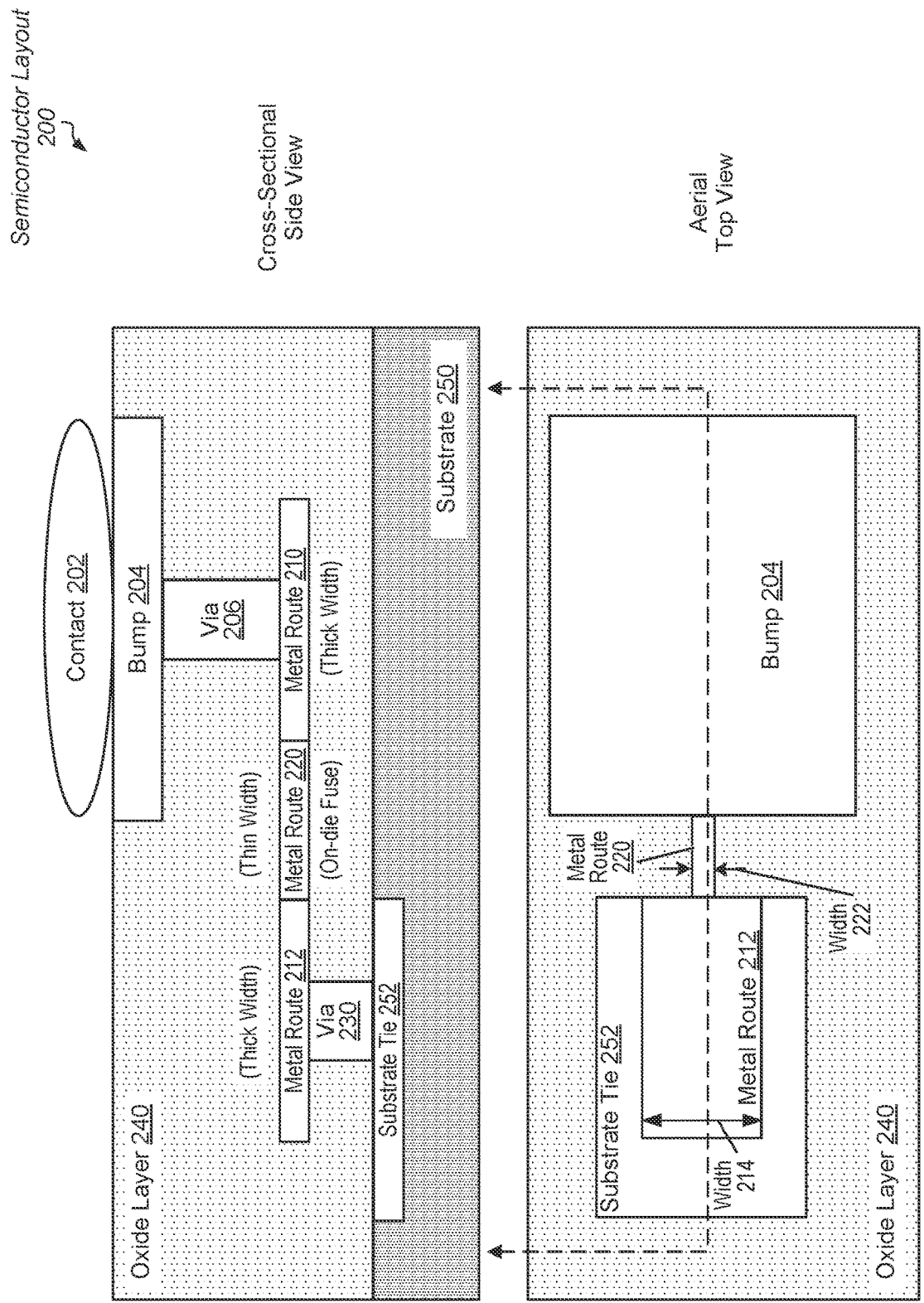
FIG. 2 is a generalized diagram of one embodiment of semiconductor layout with on-die fuses.

Referring to FIG. 2, a generalized block diagram of one embodiment of semiconductor layout 200 with on-die fuses is shown. The semiconductor layout 200 represents one area of a semiconductor die. In various embodiments, the layout components shown in the semiconductor layout 200 are replicated across the semiconductor die. Both an aerial top view (bottom of FIG. 2) and a cross-sectional side view (top of FIG. 2) of the semiconductor layout 200 with on-die fuses are provided.

The semiconductor layout 200 includes one or more oxide layers, such as oxide layer 240, formed on top of a silicon substrate 250. The oxide layer 240 provides an insulation layer between multiple meal layers and devices (active and passive) formed on a semiconductor die. A semiconductor contact (or contact) 202 provides a conductive path to an external silicon substrate or an external package. For example, in some embodiments, the contact 202 is a metal ball used for flip chip packaging or used for solder connections to a package. The contact 202 includes one of a variety of metals used for conducting current and the contact 202 makes contact with a semiconductor bump (or bump) 204.

Similar to the contact 202, the bump 204 includes metal for conducting current between a component external to the semiconductor die and layout components within the semiconductor die. For example, the bump 204 is formed on top of the via 206, which also makes contact with metal route 210. As shown, an electrical series connection is created between the via 206 and the via 230. This electrical series connection includes the metal route 210, the metal route 220 and the metal route 212. The metal route 220 is formed between the metal route 210 and the metal route 212. In other words, the metal route 210, the metal route 220 and the metal route 212 are connected in a series configuration with no vias or other paths to other metal layers located vertically above or below the metal routes 210, 220 and 212. As shown, metal route 220 has a metal width (or width) 222 less than a width 214 of the metal route 212.

The metal widths, such as width 214 of metal route 212 and width 222 of metal route 212, the metal pitch, and the spacing of metal routes and vias of the semiconductor layout 200 uses one of a variety of lithography techniques used in semiconductor fabrication. For example, in some embodiments, the extreme ultraviolet lithography (EUV) technique is used to provide the resolution of each of metal widths and metal pitch. The EUV technique uses an extreme ultraviolet wavelength to reach resolution below 40 nanometers. The extreme ultraviolet wavelength is approximately 13.5 nanometers. Relatively high temperature and high density plasma is used to provide the EUV beam. In other embodiments, the directed self-assembly (DSA) lithography technique is used to provide the resolution of each of metal widths and metal pitch. The DSA technique takes advantage of the self-assembling properties of materials to reach nanoscale dimensions. Other examples of lithography techniques are the immersion lithography technique and the double patterning technique.

The height of the metal routes 210, 220 and 212 are set by design rules for the particular metal layer of these metal routes. For example, to provide circuits for implementing a variety of functions and capabilities, the semiconductor die includes multiple metal layers, and a given metal layer is oriented in a direction perpendicular to metal layers above and below the given metal layer. In one embodiment, the semiconductor die includes a horizontal metal zero, a vertical metal one, a horizontal metal two, a vertical metal three, and so on. At least one metal layer is implemented with different material than another one of the metal layers in the semiconductor die. Therefore, the height, the minimum width and the pitch varies between at least two metal layers of the semiconductor die.

In some embodiments, the metal widths of the metal routes 210 and 212 are the same and it is width 214. In other embodiments, the metal widths of the metal routes 210 and 212 are different, but the metal widths are both greater than a threshold. The threshold is set as a metal width that becomes incapable of conducting a critical current density that causes conductive failure when flowing through active devices, passive devices and metal routes with a minimum metal width of a particular metal layer of a semiconductor die. In other words, it is known from a fabrication testing phase, what is the critical current density that causes damage to components on the semiconductor die at different metal layers of the semiconductor die.

In various embodiments, the width 222 of metal route 220 is less than the metal widths of the metal routes 210 and 212. In an embodiment, the metal width (or width) 222 of the metal route 220 is representative of the minimum metal width of the particular metal layer used to form the metal routes 210, 220 and 212, and the metal route 220 with the width 222 will experience conductive failure when the critical current density flows through it. Therefore, the width 222 of the metal route 220 is equal to or less than the threshold, whereas, the widths of the metal routes 210 and 212 are greater than the threshold. Accordingly, the metal route 220 is used as an electrical on-die fuse used to detect and measure electrostatic discharge events during assembly of a semiconductor chip. In other embodiments, the metal route 220 is replaced with an active device such as one of an n-type transistor and a p-type transistor. The transistor is capable of detecting the critical current density at a finer granularity (finer width) than a metal route. Therefore, despite consuming more on-die area, the detection of an electrostatic discharge event and a measurement of an amount of current density flowing as a result of the electrostatic discharge event occurs with finer granularities. In such embodiments, the transistor is connected in a diode configuration such as having the source and gate terminals shorted together.

The semiconductor layout 200 includes the via 230 between the metal route 212 and a silicon substrate via the substrate tie 252. Similar to substrate taps and well taps, the substrate tie 252 is formed by creating a high-doped region of an opposite polarity than the substrate 250. For a p-type silicon substrate, in one example, a relatively high-doped p-type region is created to form the substrate tie 252. Conversely, for an n-type silicon substrate, a relatively high-doped n-type region is created to form the substrate tie 252. When an electrostatic discharge event occurs on the contact 202, a resulting current flows from the contact 202 through the bump 204, and prior to conductive failure, through one or more of the via 206, the metal route 210, the metal route 220 (or transistor), the metal route 212, the via 230, and the substrate tie 252. If the current density rises above a threshold amount, the metal route 220 (or transistor) experiences conductive failure by breaking down, and current flow ends. Therefore, the metal route 220 (or transistor) acts as an on-die fuse capable of detecting whether an electrostatic discharge event occurred. In addition, it is known that at least the threshold amount of current flowed through the series path beginning at the contact 202. It is noted that the series path created between the contact 202 and the substrate tie 252 can be replicated across the semiconductor die, and additionally, can be replicated using other metal layers. The heights and widths of the metal routs and resistive elements are adjusted based on the particular metal layer being used.

Figure 3:
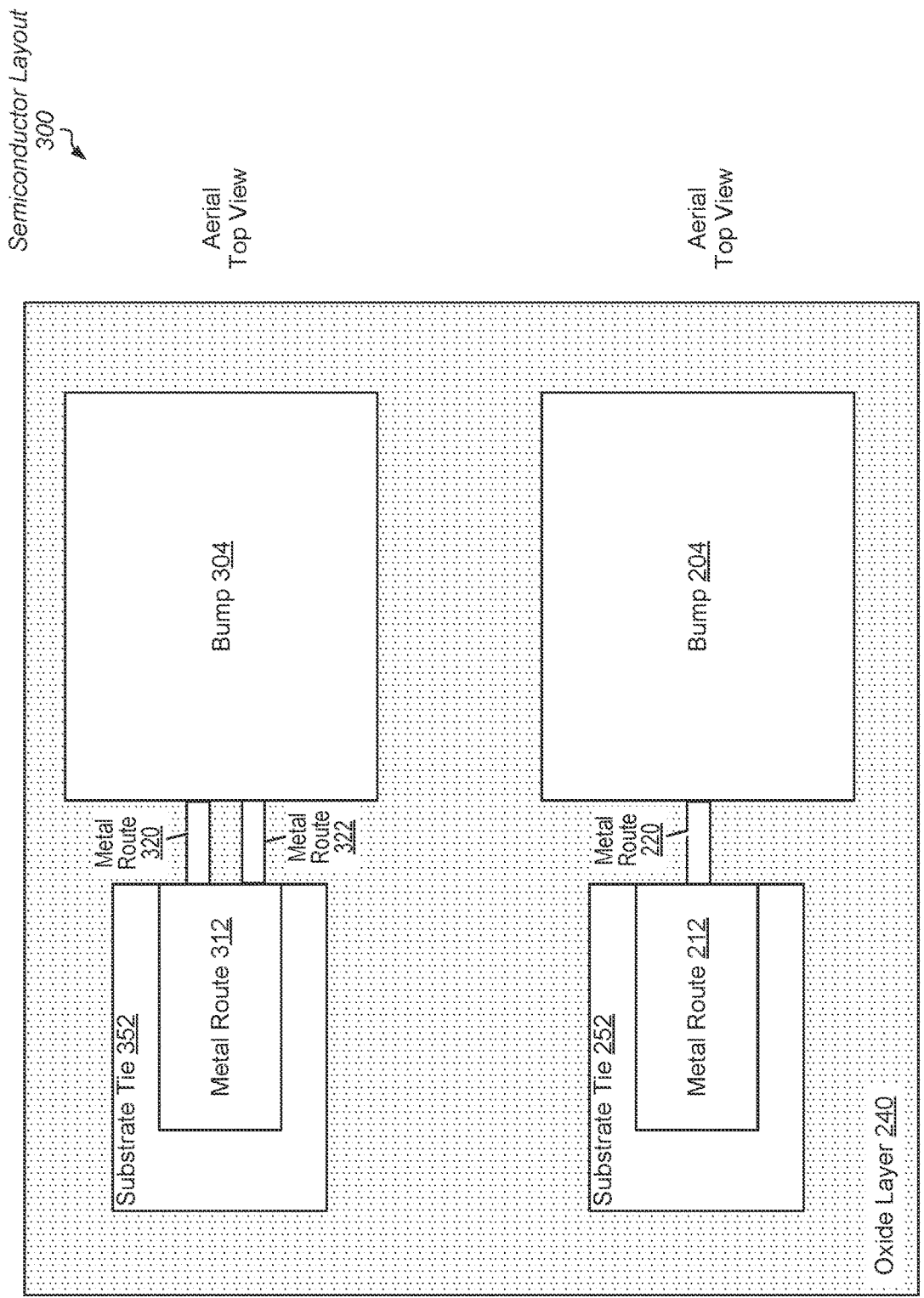
FIG. 3 is a generalized diagram of one embodiment of semiconductor layout with on-die fuses.

Turning now to FIG. 3, a generalized block diagram of one embodiment of on-die fuses 300 is shown. Semiconductor material and layout elements described earlier are numbered identically. The semiconductor layout 300 shows two locations on a semiconductor die used for placement of electrical fuses. Although the bumps 204 and 304 are shown relatively close to one another, in various embodiments, these bumps are placed on opposite areas across the semiconductor die or in other areas on the semiconductor die relatively far from one another. A first electrical fuse is implemented by the metal route 220 in the series path between the bump 204 and the substrate tie 252, which also includes the metal route 212. A second electrical fuse is implemented by the metal routes 320 and 322 in the series path between the bump 304 and the substrate tie 352, which also includes the metal route 312.

In some embodiments, one or more of the metal routes 220, 320 and 322 are replaced with transistors connected in a diode configuration. In yet other embodiments, one or more of the metal routes 220, 320 and 322 are replaced with poly resistors, well resistors, gate fins and other resistive devices to be used as electrical on-die fuses. Although a single metal route 220 is used for the first on-die fuse and two metal routes 320 and 322 are used for the second on-die fuse, in other implementations, another number of metal routes (or other resistive elements) with a width less than a threshold are used to implement an on-die fuse.

Using multiple metal routes (or other resistive elements) provides a more accurate measurement of an amount of current that flowed when an electrostatic discharge event occurred on a corresponding bump. For example, if only the metal route 220 experiences conductive failure, then it is known that at least a critical current density flowed through the bump 204 during the electrostatic discharge event. If the metal routes 320 and 322 experienced conductive failure, then it is known that at least twice the critical current density flowed through the bump 304 during the electrostatic discharge event. By increasing the number of conductors (metal routes or other resistive elements) connected in a parallel manner in the series path, the measurement of the current density becomes more finely tuned.

Figure 4:
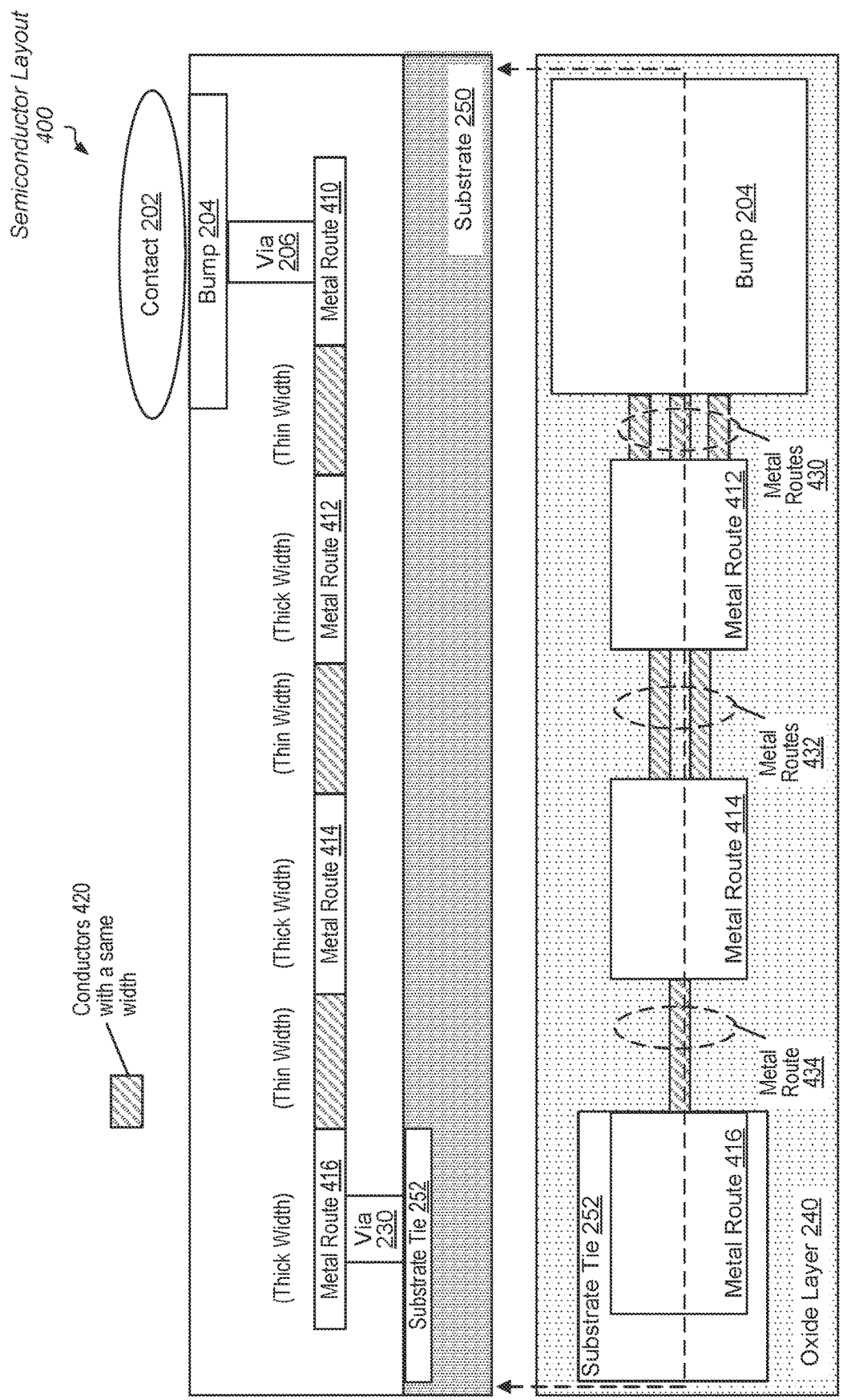
FIG. 4 is a generalized diagram of one embodiment of semiconductor layout with on-die fuses.

Referring to FIG. 4, a generalized block diagram of one embodiment of on-die fuses 400 is shown. Semiconductor material and layout elements described earlier are numbered identically. Both an aerial top view (bottom of FIG. 4) and a cross-sectional side view (top of FIG. 4) of the semiconductor layout 400 with on-die fuses are provided. The semiconductor layout 400 includes multiple metal routes 410, 412, 414 and 416, and the metal routes 410-416 are separated from one another in a series configuration where the series configuration uses a same metal layer of multiple metal layers. In various embodiments, the widths of the metal routes 410-416 are greater than a threshold based on a metal width capable of conducting a critical current density without conductive failure or breakdown.

The semiconductor layout 400 includes multiple conductors 420 with a width less than the threshold. The conductors 420 are shown as metal routes 430, metal routes 432 and metal route 434. However, as described earlier, one or more of the conductors 420 are implemented by transistors, poly resistors, well resistors, gate fins and other resistive devices. The metal routes 430, metal routes 432 and metal route 434 are between any two of the multiple metal routes 410-416, and in between any two of the multiple metal routes 410-416, the metal routes 430 and 432 are connected in a parallel configuration with one another. For example, the metal routes 430 are located between the metal routes 410 and 412. The metal routes 432 are located between the metal routes 412 and 414. The metal route 434 is located between the metal routes 414 and 416. Although a particular number of conductors are shown, in other embodiments, another number of conductors is used. Similarly, in other embodiments, another number of metal routes 410-416 using a width greater than a threshold is used.

Using the implementation shown in semiconductor layout 400, after placement of the semiconductor die on another substrate or on a package, if only metal route 434 experienced conductive failure, then then it is known that at least a critical current density flowed through the bump 204 during the electrostatic discharge event. However, if metal routes 432 and 434 experienced conductive failure, then then it is known that at least twice the critical current density flowed through the bump 204 during the electrostatic discharge event. If metal routes 430, 432 and 434 experienced conductive failure, then then it is known that at least three times the critical current density flowed through the bump 204 during the electrostatic discharge event. By changing the number of conductors (metal routes or other resistive elements) connected in a parallel manner in the series path, the granularity of the measurement of the current density is updated.

Figure 5:
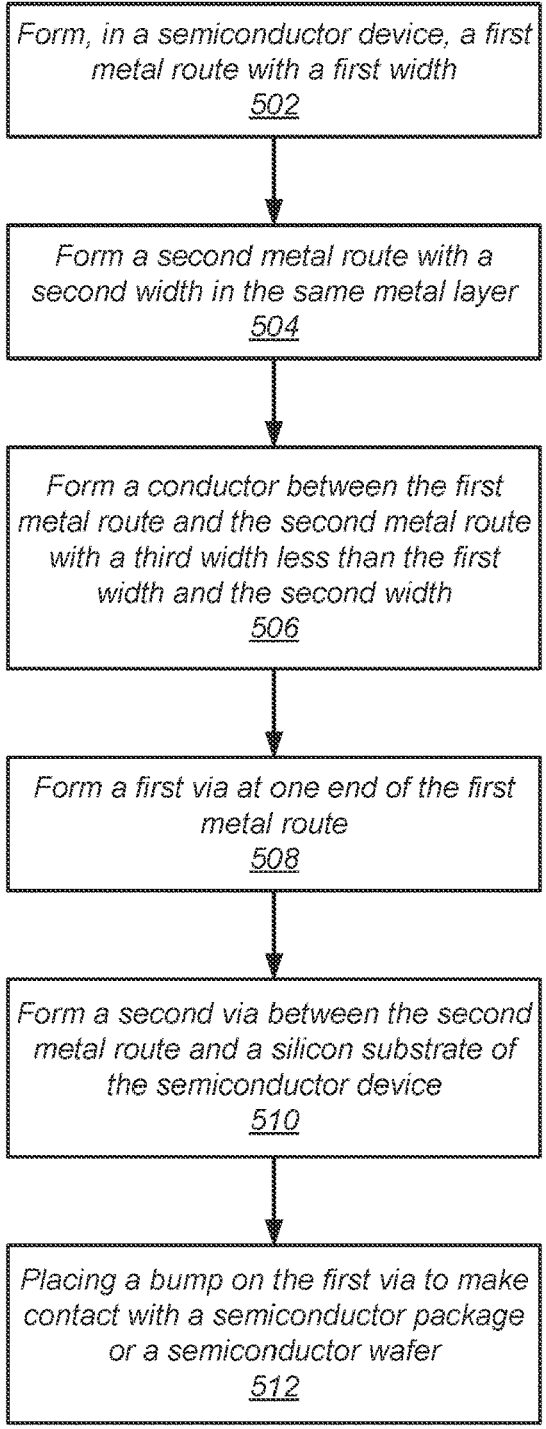
FIG. 5 is a generalized diagram of one embodiment of a method for detecting and measuring electrostatic discharge during semiconductor assembly.

Referring to FIG. 5, one embodiment of a method 500 for detecting and measuring electrostatic discharge during semiconductor assembly is shown. For purposes of discussion, the steps in this embodiment (as well as in FIGS. 6-7) are shown in sequential order. However, in other embodiments some steps occur in a different order than shown, some steps are performed concurrently, some steps are combined with other steps, and some steps are absent.

A semiconductor fabrication process forms, in a semiconductor device, a first metal route with a first metal width, or first width (block 502). The height of the first metal route is set by design rules for the particular metal layer of the first metal route. The semiconductor fabrication process forms a second metal route with a second width in the same metal layer (block 504). In some embodiments, the first width and the second width are the same. In other embodiments, the first width and the second width are both greater than a threshold. The threshold is set as a metal width that is capable of conducting a critical current density that causes conductive failure when flowing through active devices, passive device and minimum metal widths of a particular metal layer of a semiconductor die.

The semiconductor fabrication process forms a conductor between the first metal route and the second metal route with a third width less than the first width and the second width (block 506). In other words, the first metal route, the conductor, and the second metal route are connected in a series configuration with no vias or other paths to other metal layers. Such a series configuration is shown with metal routes 210, 212 and 220 of the semiconductor layout 200 (of FIG. 2). In some embodiments, the conductor is a metal route using the same metal layer as the first metal route and the second metal route. However, the third width is representative of the minimum metal width of the particular metal layer used to form the first metal route and the second metal route. Therefore, the third width is equal to or less than the threshold, whereas, each of the first width and the second width is greater than the threshold. Accordingly, the third metal route is used as an electrical on-die fuse used to detect and measure electrostatic discharge events during assembly of a semiconductor chip. In other embodiments, the conductor is implemented by an active device such as one of an n-type transistor and a p-type transistor. The transistor is capable of detecting current densities at a finer granularity than a metal route. Therefore, despite consuming more on-die area, the detection of an electrostatic discharge event and a measurement of an amount of current density flowing as a result of the electrostatic discharge event occurs with finer granularities.

The semiconductor fabrication process forms a first via at one end of the first metal route (block 508), and forms a second via between the second metal route and a silicon substrate of the semiconductor device (block 510). The first via is equivalent to via 206 of semiconductor layout 200 and the second via is equivalent to via 230 of semiconductor layout 200 (of FIG. 2). It is understood that the semiconductor fabrication process forms the many components and materials in a layering manner from bottom to top. Therefore, the second via was formed prior to forming the metal routes and the first via.

The semiconductor fabrication process places a semiconductor bump on the first via to make contact with a semiconductor package or a semiconductor wafer (block 512). Therefore, when an electrostatic discharge event occurs on the bump, a resulting current flows from the bump through one or more of the first via, the first metal route, the conductor, the second metal route, and the second via to reach the silicon substrate. However, if the current density rises above a threshold amount, the conductor experiences conductive failure by breaking down, and current flow ends. Therefore, the conductor acts as an on-die fuse capable of detecting whether an electrostatic discharge event occurred. In addition, it is known that at least the threshold amount of current flowed through the series path from the bump to the silicon substrate.

Turning now to FIG. 6, one embodiment of a method 600 for detecting and measuring electrostatic discharge during semiconductor assembly is shown. A semiconductor fabrication process forms, in a semiconductor device, multiple metal routes with a first width, and the multiple metal routes are separated from one another in a series configuration using a first metal layer of multiple metal layers (block 602).

For example, the semiconductor fabrication process forms metal routes similar to metal routes 410-416 (of FIG. 4). In various embodiments, the first width is greater than a threshold based on a metal width capable of conducting a critical current density without conductive failure or breakdown.

The semiconductor fabrication process forms multiple conductors with a second width less than the first width between any two of the multiple metal routes, and in between any two of the multiple metal routes, one or more conductors are connected in a parallel configuration with one another (block 604). For example, the semiconductor fabrication process forms conductors similar to metal routes 430-434 (of FIG. 4). In various embodiments, the second width is equal to or less than the threshold. In some embodiments, the conductors are metal routes of a same metal layer. In other embodiments, the conductors are transistors connected in a diode configuration.

The semiconductor fabrication process forms a first via on a first metal route of the multiple metal routes (block 606), and forms a second via between a second metal route of the multiple metal routes and a silicon substrate of the semiconductor device (block 608). It is understood that the semiconductor fabrication process forms the many components and materials in a layering manner from bottom to top. Therefore, the second via was formed prior to forming the metal routes, the conductors and the first via. The semiconductor fabrication process places a bump on the first via to make contact with a semiconductor package or a semiconductor wafer (block 610). Therefore, at a late time, based on which conductors and a number of conductors experiencing breakdown, a measurement of an amount of current flowing due to an electrostatic discharge event can be performed.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A semiconductor device comprising:
    a first bump configured to make contact with a semiconductor package or a semiconductor wafer;
    a first metal route in a first metal layer with a first width;
    a second metal route in the first metal layer with a second width;
    a first conductor, in the first metal layer, between the first metal route and the second metal route with a third width less than the first width and the second width;
    a first via between the first bump and the first metal route; and
    a second via between the second metal route and a silicon substrate.

2. The semiconductor device as recited in claim 1, wherein the first conductor comprises a third metal route in the first metal layer with the third width.

3. The semiconductor device as recited in claim 1, wherein the first conductor comprises a field effect transistor with the third width.

4. The semiconductor device as recited in claim 1, wherein the third width of the first conductor is based on a maximum amount of current permitted to flow in the first metal layer due to an electrostatic discharge on the first bump during assembly of the semiconductor device to the semiconductor package or a semiconductor wafer.

5. The semiconductor device as recited in claim 1, further comprising a second conductor different from the first conductor between the first metal route and the second metal route with a fourth width less than the first width and the second width.

6. The semiconductor device as recited in claim 1, further comprising:
    a second bump configured to make contact with the semiconductor package or the semiconductor wafer;
    a third metal route in a second metal layer different from the first metal layer with a fourth width;
    a fourth metal route in the second metal layer with a fifth width;
    a third conductor between the third metal route and the fourth metal route with a sixth width less than the fourth width and the fifth width;
    a third via between the first bump and the third metal route; and
    a fourth via between the fourth metal route and a silicon substrate.

7. The semiconductor device as recited in claim 6, wherein the sixth width of the third conductor is based on a maximum amount of current permitted to flow in the second metal layer due to an electrostatic discharge on the second bump during assembly of the semiconductor device to the semiconductor package or a semiconductor wafer.

8. The semiconductor device as recited in claim 1, wherein based on receiving a positive, non-zero voltage level on the first bump, the semiconductor device is configured to conduct a current from the first bump to the second via.

9. A semiconductor device fabrication process comprising:
    forming, in a semiconductor device, a first metal route in a first metal layer with a first width;
    forming a second metal route in the first metal layer with a second width; and
    forming a first conductor, in the first metal layer, between the first metal route and the second metal route with a third width less than the first width and the second width;
    forming a first via at one end of the first metal route;
    forming a second via between the second metal route and a silicon substrate of the semiconductor device; and
    placing a first bump on the first via to make contact with a semiconductor package or a semiconductor wafer.

10. The semiconductor device fabrication process as recited in claim 9, further comprising forming a third metal route in the first metal layer with the third width to create the first conductor.

11. The semiconductor device fabrication process as recited in claim 9, further comprising forming a field effect transistor with the third width to create the first conductor.

12. The semiconductor device fabrication process as recited in claim 9, further comprising forming the first conductor with the third width based on a maximum amount of current permitted to flow in the first metal layer due to an electrostatic discharge on the first bump during assembly of the semiconductor device to the semiconductor package or a semiconductor wafer.

13. The semiconductor device fabrication process as recited in claim 9, further comprising forming a second conductor different from the first conductor between the first metal route and the second metal route with a fourth width less than the first width and the second width.

14. The semiconductor device fabrication process as recited in claim 13, further comprising:
    forming, in the semiconductor device, a third metal route in a second metal layer different from the first metal layer with a fourth width;
    forming a fourth metal route comprising the second metal layer with a fifth width;
    forming a third conductor between the third metal route and the fourth metal route with a sixth width less than the fourth width and the fifth width;
    forming a third via between the first bump and the third metal route; and
    forming a fourth via between the fourth metal route and a silicon substrate; and
    placing a second bump on the third via to make contact with the semiconductor package or the semiconductor wafer.

15. The semiconductor device fabrication process as recited in claim 14, further comprising forming the third conductor with the sixth width based on a maximum amount of current permitted to flow in the second metal layer due to an electrostatic discharge on the second bump during assembly of the semiconductor device to the semiconductor package or a semiconductor wafer.

16. A method for fabricating a semiconductor device comprising:
  forming, in a semiconductor device, a plurality of metal routes with a first width separated from one another in a series configuration in a first metal layer of a plurality of metal layers;
  forming a plurality of conductors, in the first metal layer, with a second width less than the first width between any two of the plurality of metal routes, wherein between any two of the plurality of metal routes one or more conductors are connected in a parallel configuration with one another;
  forming a first via on a first metal route of the plurality of metal routes;
  forming a second via between a second metal route of the plurality of metal routes and a silicon substrate of the semiconductor device; and
  placing a bump on the first via to make contact with a semiconductor package or a semiconductor wafer.

17. The method as recited in claim 16, further comprising forming a number of conductors of the plurality of conductors between any two metal routes of the plurality of metal routes different than a number of conductors between any other two metal routes.

18. The method as recited in claim 17, further comprising forming a number of conductors of the plurality of conductors between any two metal routes of the plurality of metal routes less than a number of conductors between another two metal routes located closer to the bump.

19. The method as recited in claim 16, further comprising forming a plurality of metal routes in the first metal layer with the second width to create the plurality of conductors.

20. The method as recited in claim 16, wherein in response to receiving a positive, non-zero voltage level on the bump, the method further comprises conducting a current from the bump through one or more of the plurality of conductors.

* * * * *